United States Patent
Iino et al.

[11] Patent Number: 6,104,164
[45] Date of Patent: Aug. 15, 2000

[54] CELL VOLTAGE DETECTING DEVICE FOR COMBINATION BATTERY

[75] Inventors: Junichi Iino, Kariya; Hidetoshi Kato, Suzuka, both of Japan

[73] Assignee: Denso Corporation, Kariya, Japan

[21] Appl. No.: 09/420,412

[22] Filed: Oct. 19, 1999

[30] Foreign Application Priority Data

| | | | |
|---|---|---|---|
| Oct. 20, 1998 | [JP] | Japan | 10-298194 |
| Oct. 20, 1998 | [JP] | Japan | 10-298205 |
| Oct. 27, 1998 | [JP] | Japan | 10-305969 |
| Dec. 28, 1998 | [JP] | Japan | 10-373281 |

[51] Int. Cl.$^7$ ............... H02J 7/00; G08B 17/12
[52] U.S. Cl. .............................. 320/116; 702/73
[58] Field of Search .................. 320/116, 119; 324/433; 702/73

[56] References Cited

U.S. PATENT DOCUMENTS

| | | | |
|---|---|---|---|
| 5,387,857 | 2/1995 | Honda et al. | 320/120 |
| 5,557,189 | 9/1996 | Suzuki et al. | 320/116 |
| 5,625,272 | 4/1997 | Takahashi | 320/116 |
| 5,705,914 | 1/1998 | Morita | 340/636 |
| 5,932,932 | 8/1999 | Agatsuma et al. | 320/116 |

FOREIGN PATENT DOCUMENTS 828 304  3/1998  European Pat. Off. .

*Primary Examiner*—Peter S. Wong
*Assistant Examiner*—Pia Tibbits
*Attorney, Agent, or Firm*—Pillsbury, Madison & Sutro LLP

[57] ABSTRACT

A device for detecting a voltage of an individual unit cell included in a combination battery consisting of a number of unit cells connected in series. The unit cells are divided into several groups, and a voltage divider circuit having a cell-side resistor and a reference-side resistor is connected to each unit cell. A divided potential of each unit cell is supplied to a cell voltage detector from each voltage divider circuit. Also, a reference potential that is common to a cell group is supplied to the detector from a junction connecting two neighboring cell groups. The cell voltage detector determines the voltage of each unit cell, group by group, based on a difference between the divided potential and the reference potential. Since the reference potential is common to all the voltage divider circuits in one cell group, the voltage divider circuits can be simplified. To further simplify the circuits, the reference-side resistors for the first cell group are commonly used as the reference-side resistors for other cell groups.

18 Claims, 14 Drawing Sheets

CELL VOLTAGE DETECTING DEVICE FOR COMBINATION BATTERY

CROSS-REFERENCE TO RELATED APPLICATIONS

This application is based upon and claims benefit of priority of Japanese Patent Applications No. Hei-10-298194 filed on Oct. 20, 1998, No. Hei-10-298205 filed on Oct. 20, 1998, No. Hei-10-305969 filed on Oct. 27, 1998, and No. Hei-10-373281 filed on Dec. 28, 1998, the contents of which are incorporated herein by reference.

BACKGROUND OF THE INVENTION

1. Field of the Invention

The present invention relates to a device for detecting individual unit cell voltage in a combination battery that includes a plurality of unit cells connected in series.

2. Description of Related Art

JP-A-5-64377 discloses a device for detecting unit cell voltage in a combination battery that includes a plurality of unit cells. A voltage of an individual unit cell in the combination battery is detected by a differential-type voltage detecting circuit which is connected to each unit cell. Since the combination battery usually includes a large number of unit cells and the same number of the detector circuits is necessary in this device, the voltage detector is large in size, consumes high power. Moreover, its manufacturing cost is high, and its reliability is not sufficiently high.

SUMMARY OF THE INVENTION

The present invention has been made in view of the above-mentioned problem, and an object of the present invention is to provide an improved device for detecting unit cell voltage in a combination battery, which is simple in the circuit structure and has high detection accuracy and high reliability.

The combination battery consists of a number of unit cells connected in series, and the unit cells are divided into several cell groups. One cell group includes, for example, five unit cells, and four cell groups are connected in series, constituting a combination battery. The unit cell voltage detecting device is composed of voltage divider circuits, each connected to a plus terminal of each unit cell, and a cell voltage detector connected to the voltage divider circuits. Each voltage divider circuit includes at least a cell-side resistor connected to the unit cell and a reference-side resistor connected to a reference potential line. The cell-side resistor and the reference-side resistor are connected in series in the voltage divider circuit. The reference potential line is connected to a common terminal between the cell groups, for example, between the first cell group and the second cell group.

A divided potential of each unit cell is supplied to a high potential side of the cell voltage detector from a junction between the cell-side resistor and the reference-side resistor. A reference potential of each cell group is supplied to a low potential side of the cell voltage detector from the common terminal that is a junction of a neighboring couple of cell groups. The unit cell voltage is detected based on the potential difference between the divided potential and the reference potential. The reference-side resistor of each voltage divider circuit in the first cell group is commonly used as a reference-side resistor of a corresponding voltage divider circuit in other cell groups. For example, the reference-side resistor of the first unit cell in the first cell group is common to the reference-side resistor of the first unit cell in the second cell group. The reference potential line includes a switch for closing and opening the reference potential line, so that the cell voltages are detected cell group by cell group. The reference-side resistors may be replaced with a common reference-side resistor by providing a switch in each voltage divider circuit.

Since the reference potential is commonly supplied to each voltage divider circuit in one cell group, and the reference-side resistors in one cell group are common to the other cell groups, the structure of the voltage divider circuits is simplified, compared with that of a conventional detector using a separate voltage divider circuit for each unit cell. Since the divided potential is supplied to the cell voltage detector, the detector can be operated under a lower voltage.

A reverse-current-preventing diode and/or a current-restricting-resistor may be inserted in the reference potential line to prevent and/or restrict current short-circuiting a cell group when two reference potential lines are simultaneously closed accidentally or due to malfunction of switches in the circuit. All the switches in the voltage divider circuits and in the reference potential lines may be integrated into a single module to further simplify the circuit structure.

To compensate possible detection errors due to unevenness among resistance values in the voltage divider circuits or other causes, a function to adjust the detected cell voltages may be included in the device. For example, an offset voltage may be subtracted from the detected voltage, and further the detected voltage may be adjusted by an adjusting factor representing a ratio between the detected voltage and the real voltage. Also, a compensation circuit for simulating a voltage drop across the reverse-current-preventing diode and the switch inserted in the reference potential line may be added, and the simulated voltage drop may be subtracted from the divided potential supplied to the cell voltage detector.

Other objects and features of the present invention will become more readily apparent from a better understanding of the preferred embodiments described below with reference to the following drawings.

DETAILED DESCRIPTION OF THE PREFERRED EMBODIMENTS

First Embodiment

Figure 1:
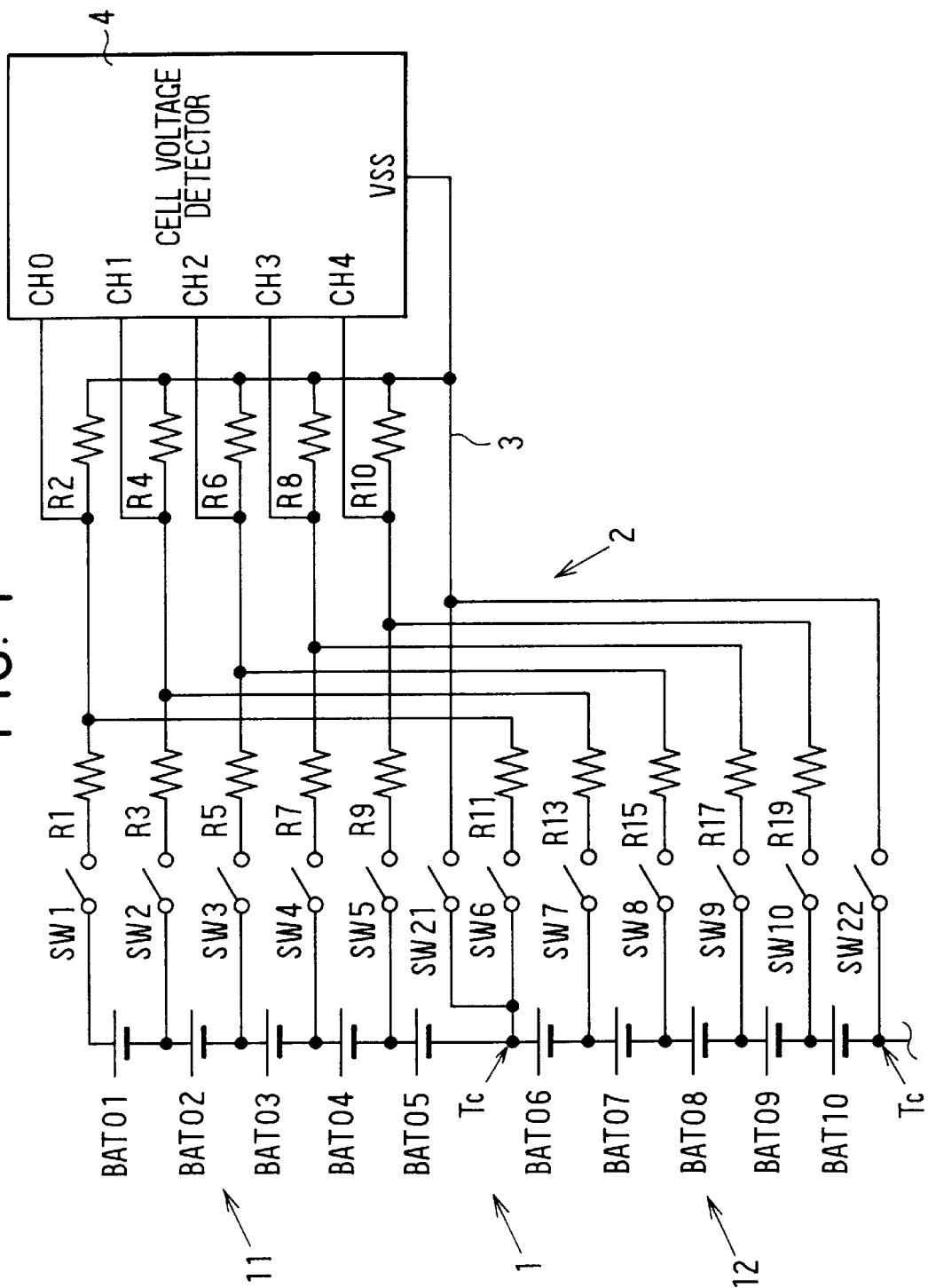
FIG. 1 is a circuit diagram showing a cell voltage detecting device as a first embodiment of the present invention.

A first embodiment of the present invention will be described with reference to FIG. 1. A combination battery includes four cell groups connected in series, each cell group having five unit cells connected in series. In FIG. 1, only the first cell group 11 and the second cell group 12 are shown, and other cell groups having the same structure are omitted from the drawing for simplicity. The first cell group 11 consisting of five unit cells, BAT01, BAT02, BAT03, BAT04 and BAT05 connected in series, is located at a highest potential position in the combination battery. The second cell group 12 consisting of five unit cells, BAT06, BAT07, BAT08, BAT09 and BAT10 connected in series, is located at a second highest potential position in the combination battery. Both cell groups 11 and 12 are connected at a common terminal Tc.

A voltage divider circuit consisting of a switch SW1, a cell-side resistor R1 and a reference-side resistor R2, all connected in series, is connected to a plus terminal of the unit cell BAT01 at one end thereof and to a reference potential line 3 at the other end thereof. Similarly, other voltage divider circuits each having the same structure are connected respectively to other unit cells BAT02, BAT03, BAT04 and BAT05 in the first cell group 11. A voltage divider circuit consisting of a switch SW6, a cell-side resistor R11 and a reference-side resistor R2, all connected in series, is connected to a plus terminal of the unit cell BAT06 at one end thereof and to the reference potential line 3 at the other end thereof. Similarly, other voltage divider circuits each having the same structure are connected respectively to other unit cells BAT07, BAT08, BAT09 and BAT10 in the second cell group 12. The cell-side resistors having odd numbers R1, R3 ... R17, R19 are provided in each voltage divider circuit, while reference-side resistors having even numbers R2, R4, R6, R8 and R10 are common to both cell groups 11 and 12. All the voltage divider circuits constitute a divider circuit group 2.

A cell voltage detector 4 is connected to the voltage divider circuits and the reference potential line 3. The cell voltage detector 4 includes five detector circuits, each being connected to respective junctions between the cell-side resistors (R1, R3 ... R17, R19) and reference-side resistors (R2, R4, R6, R8, R10) to receive divided potentials CH0, CH1, CH2, CH3 and CH4 from the respective voltage divider circuits. The cell voltage detector 4 is also connected to a reference potential line 3 to receive a reference potential VSS. The reference potential line 3 is further connected to the common terminal Tc that is a junction between the first cell group 11 and the second cell group 12 through a switch SW21. Similarly, another reference potential line 3 is connected between the reference potential terminal VSS and a lower common terminal Tc through a switch SW22. Each cell voltage detector circuit is constituted, for example, by an A/D converter that includes a reference voltage generator circuit, comparators and a digital signal generator circuit. The reference voltage generator circuit generates various reference voltages that are higher than the reference potential VSS. The comparators compare the reference voltages with the divided potentials fed from the voltage divider circuits, and the digital signal generator circuit converts the signals fed from the comparators into digital signals. Though five A/D converters are used in the detector 4 in this embodiment, a single A/D converter which sequentially switches input signals may be used.

Each switch SW1–SW10, SW21 and SW22 is composed of a photo-MOS transistor that is driven by a light signal emitted from a light emitting diode facing the switch, and thereby the switch is operated in an ON and OFF fashion.

To detect the unit cell voltages in the first cell group 11, the cell voltage detector 4 receives the reference potential VSS from the reference potential line 3 that is connected to the common terminal Tc through the closed switch SW21. At this moment, the switch SW22 is kept open. The switches SW1–SW5 are all closed, while the switches SW6–SW10 are all open. The divided potentials CH0, CH1, CH2, CH3 and CH4 are fed to the cell voltage detector 4 from the respective voltage divider circuits. The A/D converters in the cell voltage detector 4 convert the respective divided potentials into digital signals which are supplied to a controller (not shown) connected to the cell voltage detector 4. The controller determines the voltage of each unit cell BAT01–BAT05 by sequentially subtracting a lower unit cell potential from a higher unit cell potential. The unit cell voltages in the lower cell group 12 are similarly detected. That is, switches SW22 and SW6–SW10 are all closed, while the switches SW21 and SW1–SW5 are all open. Other detection processes are the same as those described above. In short, each unit cell voltage is individually detected by detecting a voltage drop across the reference-side resistors R2, R4, R6, R8 and R10.

Since the divided potentials CH0–CH4 supplied from voltage divider circuits are compared with the common reference potential VSS appearing on the reference potential line 3, the power source voltage imposed on cell voltage detector circuits can be common to all the cell voltage detector circuits. Further, since the cell voltage signals fed to the cell voltage detector circuits are divided by the voltage divider circuits, high potential imposition on the cell voltage detector circuits is avoided. Therefore, the structure of the detector circuits is simplified. Moreover, since the reference-side resistors R2, R4, R6, R8 and R10 are common to all the cell groups, the number of resistors used in the voltage divider circuits can be reduced.

Figure 4:
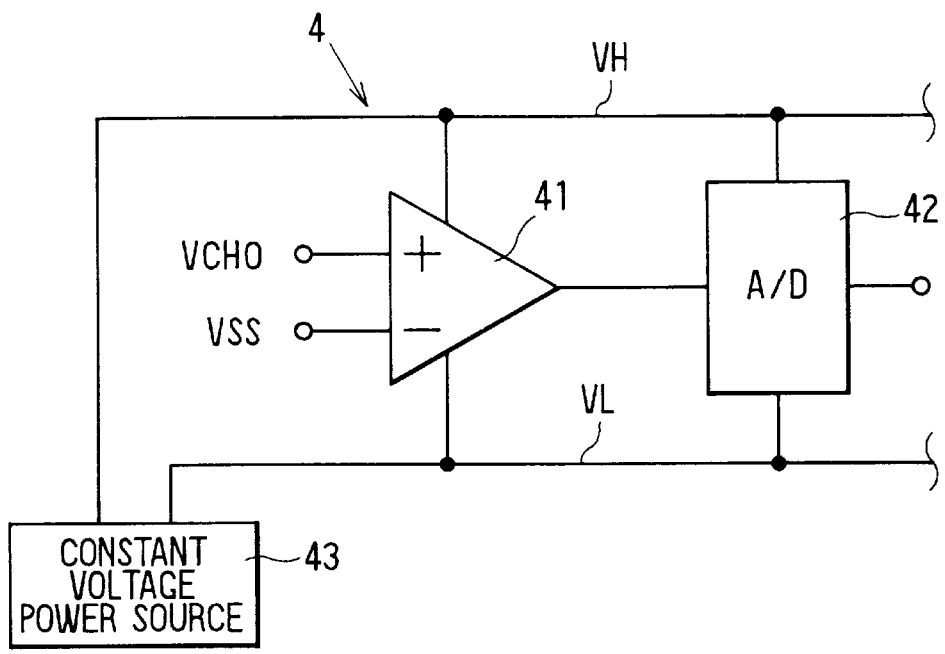
FIG. 4 is a circuit diagram showing an example of a cell voltage detector circuit.

Referring to FIG. 4, an example of the cell voltage detector circuit will be described. Five circuits identical to circuit shown in FIG. 4 are contained in the cell voltage detector 4. The cell voltage detector circuit is composed of a differential voltage circuit 41 and an A/D converter 42 that converts the output voltage of the differential voltage circuit 41 into a digital signal. A constant voltage power source 43 supplies voltage VH, VL to the circuit.

To detect the unit cell voltages in the first cell group 11, the switch SW21 is closed and the switch SW22 is opened. The differential voltage circuit 41 receives the reference potential VSS from the reference potential line 3 which is connected to the common terminal Tc through the switch SW21. The voltage VL supplied from the constant voltage source 43 is shifted to a level lower than the level of VSS, and the voltage VH is set at a level higher than the divided potential CH0. The switches SW1–SW5 for the first cell group 11 are closed while the switches SW6–SW10 are opened. Thereby, the divided potential CH0 (or CH1–CH4) are fed to the differential voltage circuit 41. The potential difference between CH0 and VSS is fed from the differential voltage circuit 41 to the A/D converter 42 that converts the signal into a digital signal. The converted digital signal is fed to the controller (not shown) connected to the A/D converter 42. The controller determines the voltage of the unit cell, for example, BAT01 by subtracting a digital signal corresponding to the divided potential CH1 from a digital signal corresponding to the divided potential CH0. The voltages of other unit cells are similarly determined.

The unit cell voltages in the second cell group 12 are similarly detected and determined. In this case, the switches SW22 and SW6–SW10 are closed, while other switches are opened.

Second Embodiment

Figure 2:
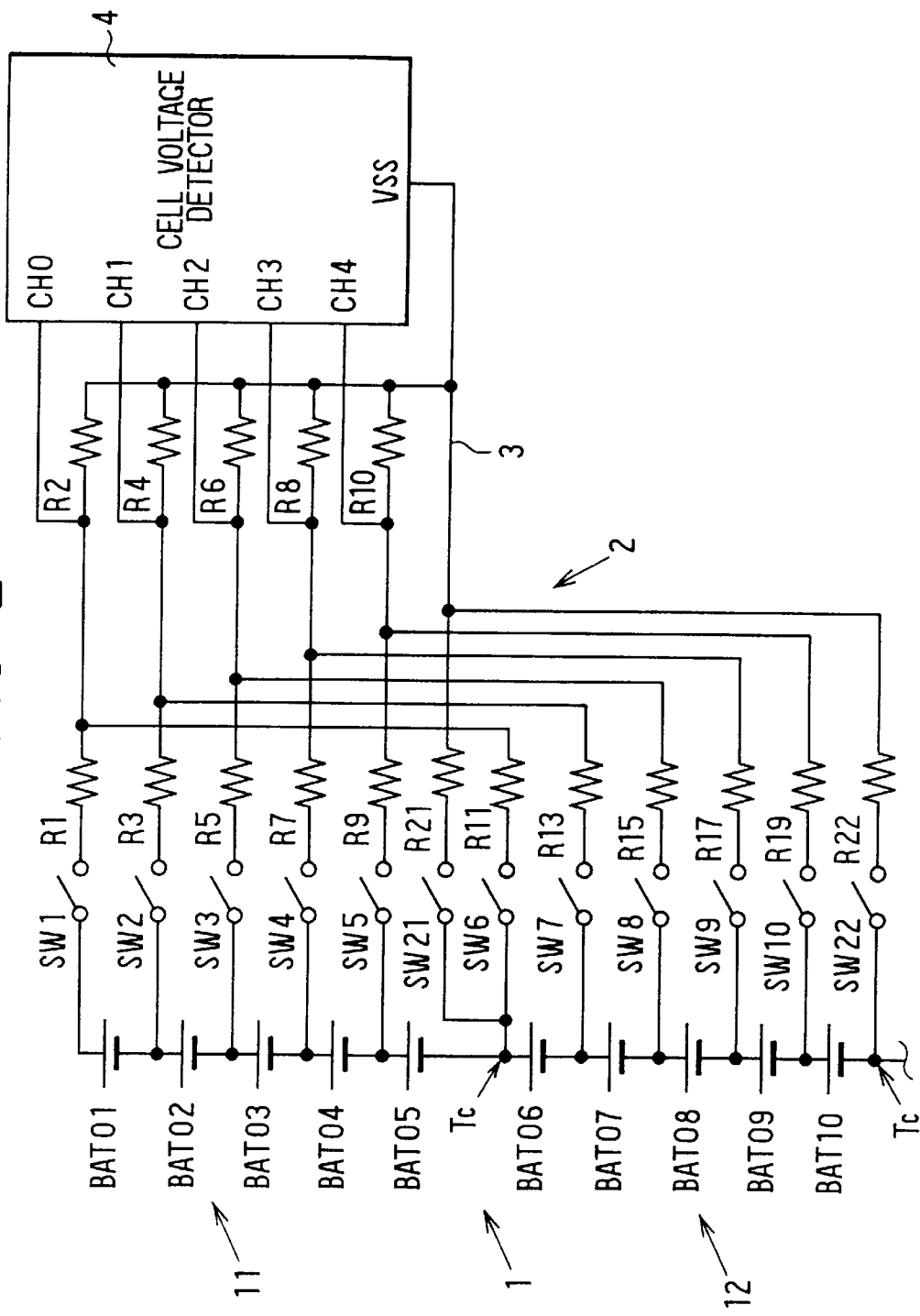
FIG. 2 is a circuit diagram showing a cell voltage detecting device as a second embodiment.

A second embodiment of the present invention is shown in FIG. 2. In this embodiment, resistors R21 and R22 are added in the reference potential lines 3, respectively. Namely, the resistor R21 is inserted between the VSS terminal and the switch SW21, and the resistor R22 is inserted between the VSS terminal and the switch SW22. A resistance ratio between the cell-side resistor and the reference-side resistor in each voltage divider circuit is properly adjusted. Other structures of the second embodiment are the same as those of the first embodiment.

If both switches SW21 and SW22 are accidentally closed at the same time for any reason including malfunction of the switches, short-circuited current therethrough is restricted by the resistors R21 and R22, thereby improving safety of the device.

Third Embodiment

Figure 3:
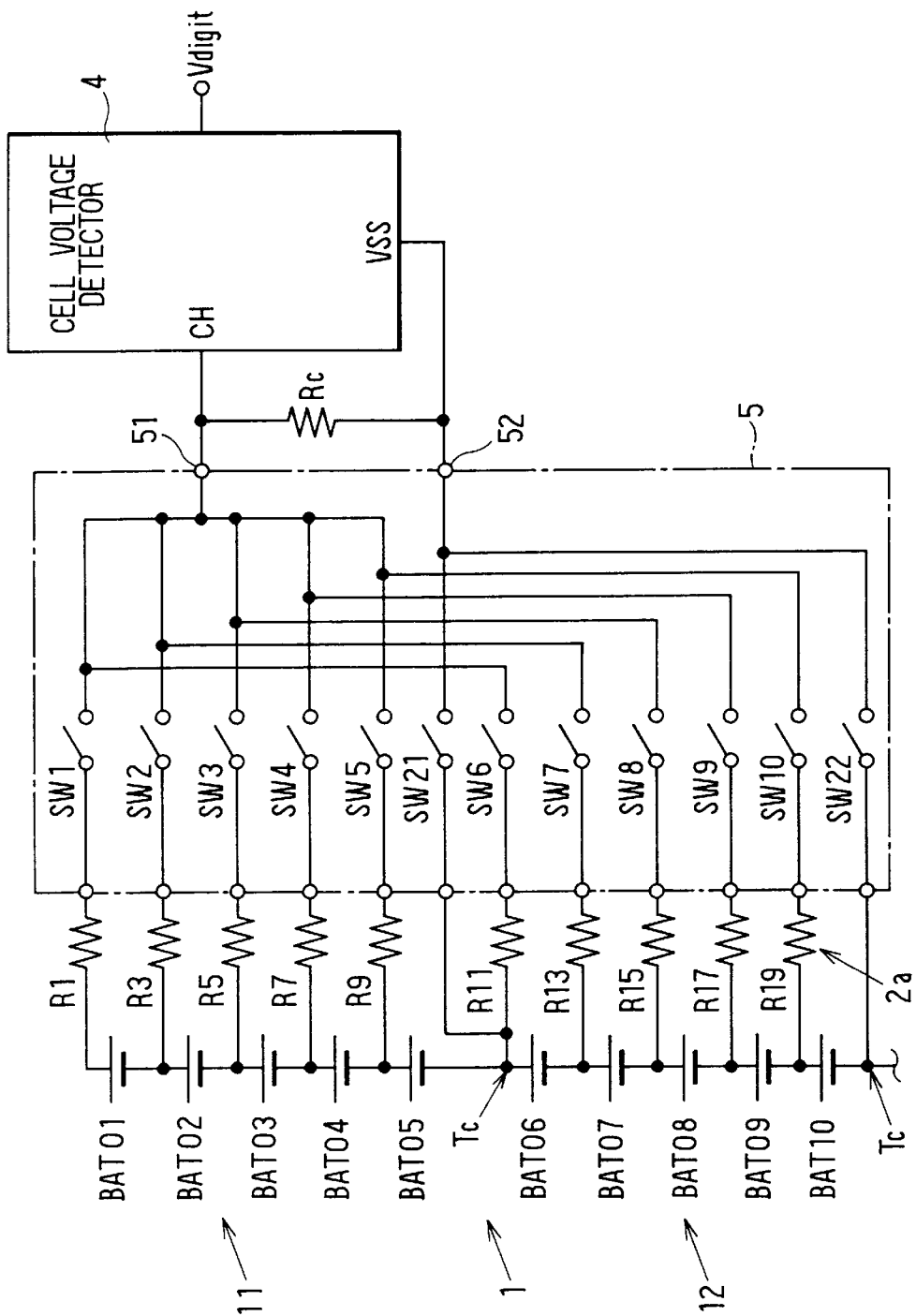
FIG. 3 is a circuit diagram showing a cell voltage detecting device as a third embodiment.

A third embodiment of the present invention is shown in FIG. 3. In this embodiment, compared with the first embodiment shown in FIG. 1, positions of the cell-side resistors 2a (i.e., R1–R9, R11–R19) and the switches SW1–SW10 in each voltage divider circuit are reversed. All the switches SW1–SW10, SW21 and SW22 constituted by MOS transistors are intergrated in a single module. The reference-side resistors R2, R4, R6, R8 and R10 used in the first embodiment are replaced with a common resistor Rc, and only one divided potential terminal HC, in place of HC0–CH4, is provided in the cell voltage detector 4 that has only one detector circuit. Other structures are the same as those of the first embodiment.

In detecting the voltages of unit cells BAT01–BAT05 included in the first cell group 11, the switch SW21 is closed to supply the reference potential VSS to the cell voltage ilk detector 4 in the same manner as in the first embodiment, but the switches SW1–SW5 are sequentially closed to feed the divided voltages to the CH terminal one by one. Similarly, in detecting the voltages of unit cells BAT06–BAT-10 included in the second cell groups 12, the switch 22 is closed, and the switches SW6–SW10 are sequentially closed. The resistors R21 and R22 used in the second embodiment may be added in this embodiment, too.

Since the input signals from the unit cells are first fed to the cell-side resistors R1–R19 and then to the switches SW1–SW10, electrostatic noise or other noise possibly superimposed with the input signals are attenuated by the cell-side resistors, and thereby the switches SW1–SW10 are protected against those noises. Since the switches SW1–SW10, SW21 and SW22 are constituted by MOS transistors, those switches can be driven by a lower voltage.

Figure 5:
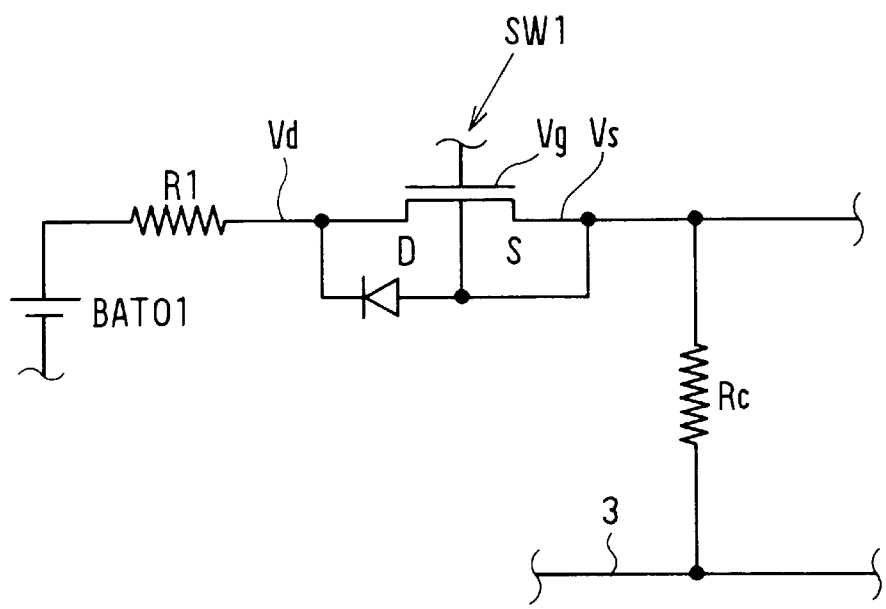
FIG. 5 is a circuit diagram showing an example of a switch used in the cell voltage detecting device.

Referring to FIG. 5, an example of the MOS transistor switch will be described. In FIG. 5, the switch SW1 is shown as an example. The switch SW1 operates under a control voltage Vgs that is a difference between a gate potential Vg and a source potential Vs. When the switch SW1 is open, the source potential Vs is equal to the reference potential VSS of line 3, and therefore the switch SW1 can be operated under the low Vgs. When the switch SW1 is closed, only the divided potential is imposed on the switch SW1 as the source potential Vs, and therefore the switch SW1 can be driven under the low Vgs.

Referring to FIG. 3 again, the switches SW1–SW10, SW21 and SW22 are all integrated into a single module. One end of switches SW1–SW10 is commonly connected to a terminal 51, and one end of switches SW21 and SW22 is commonly connected to another terminal 52. Therefore, the circuit pattern of the integrated switches can be simplified. Moreover, it is also possible to integrate all the switches in a single chip including the connecting circuit. The positions of the cellside resistors and switches in the voltage divider circuits of the first embodiment may be reversed as in the third embodiment, and those switches may be integrated in a single chip.

Figure 6:
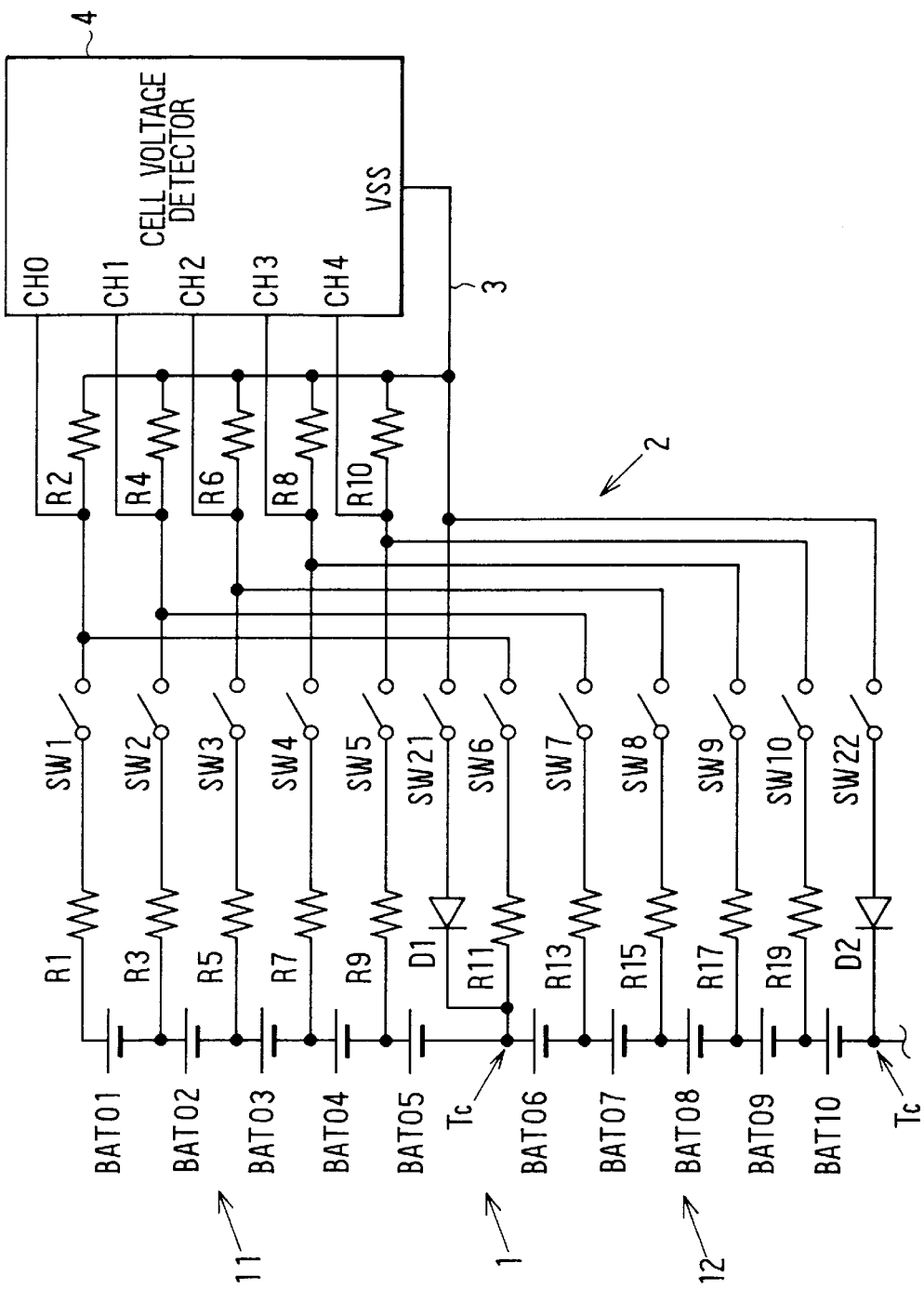
FIG. 6 is a circuit diagram showing a cell voltage detecting device as a modification of the first embodiment.

Referring to FIG. 6, a modification of the first embodiment will be described. In this modification, the switches SW1–SW10 in the voltage divider circuits are positioned between the cell-side resistors R1–R9, R11–R19 and the reference-side resistors R2–R10. Diodes D1 and D2 are added in the reference potential line 3 to intercept reverse current. Other structures are the same as those of the first embodiment. Since the diodes D1 and D2 are added in the reference potential line 3, when both switches SW21 and SW22 are accidentally closed for any reason including malfunction of those switches, current short-circuiting the unit cells included in the second cell group 12 is prevented from flowing through the reference potential line 3.

When the unit cell voltages in the first cell group 11 are being detected, a voltage drop across the diode D1 and the switch SW21 is included in the detected potential. Therefore, it is preferable to subtract the voltage drop from the detected potential difference between CH4 and VSS to determine the cell voltage of the unit cell BAT05 with a higher accuracy. The voltage drop across the diode D1 and the switch SW21 may be calculated in a program installed in the cell voltage detector 4 based on the voltages of unit cells BAT01–BAT05 and temperature of the diode D1 and the switch SW21. The same as above applies to detection of the cell voltages in the second cell group 12. The voltage drop across the diode D2 and the switch SW22 is similarly calculated.

Figure 7:
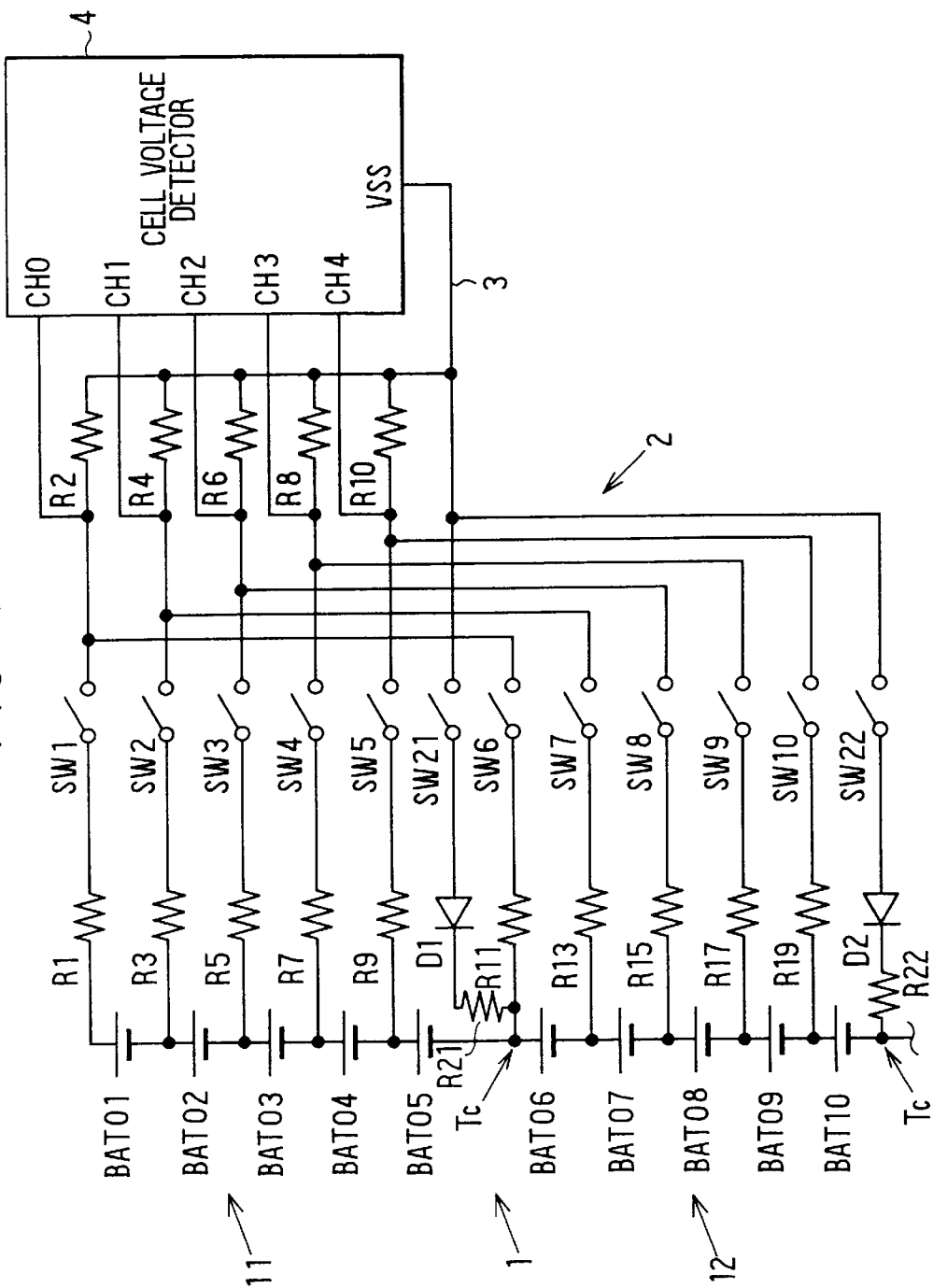
FIG. 7 is a circuit diagram showing a cell voltage detecting device as a modification of the second embodiment.

Referring to FIG. 7, a modification of the second embodiment will be described. In this modification, the switches SW1–SW10 are positioned between the cell-side resistors R1–R19 and the reference-side resistors R2–R10, and diodes D1 and D2 are added in the reference potential lines 3, respectively. Other structures are the same as those of the second embodiment. Since the diodes D1 and D2 are added, the current short-circuiting the unit cells in the second cell group 12 is prevented from flowing through the reference line 3, even if both switches SW21 and SW22 are simultaneously closed for any reason.

Figure 8:
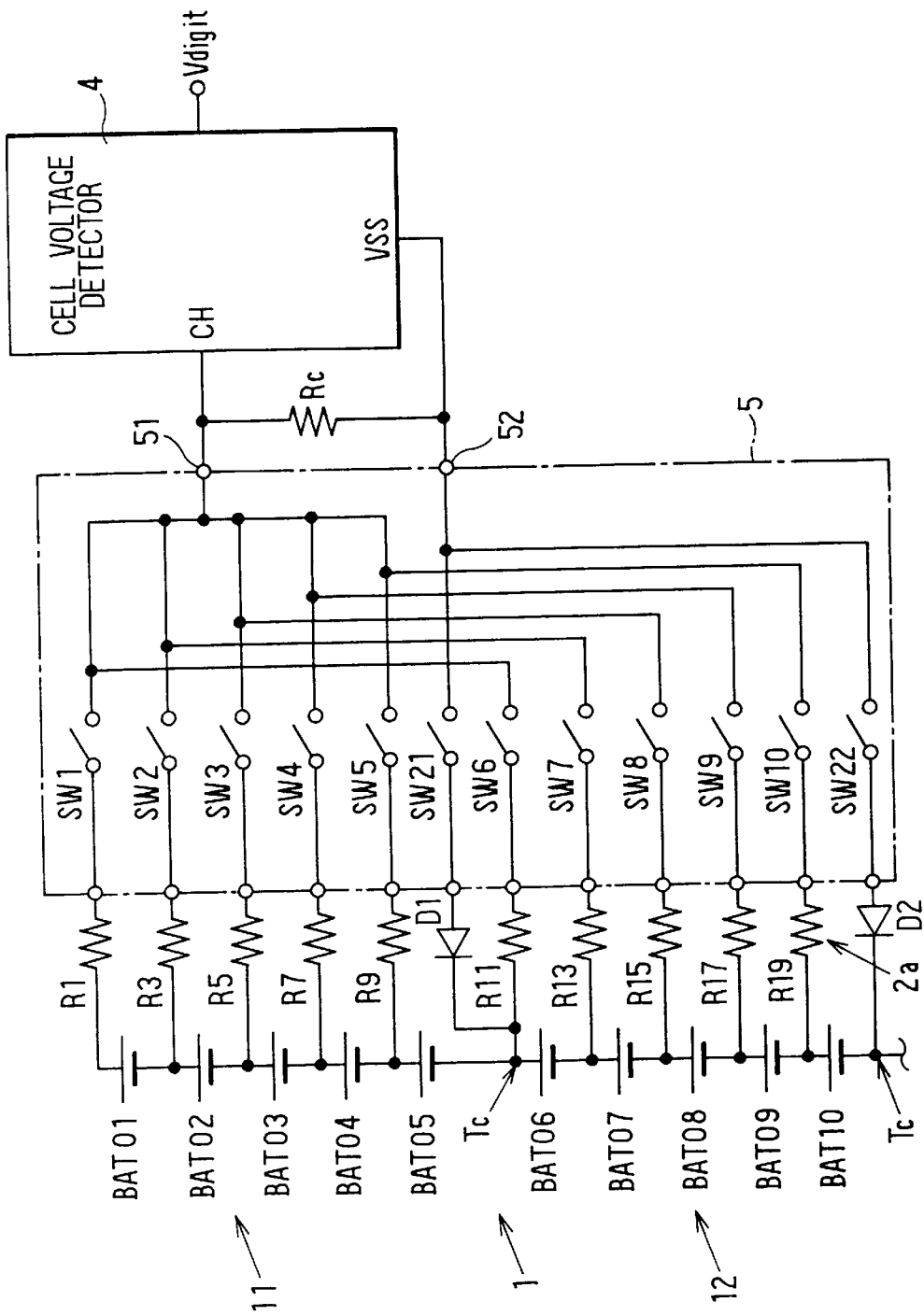
FIG. 8 is a circuit diagram showing a cell voltage detecting device as a modification of the third embodiment.

Referring to FIG. 8, a modification of the third embodiment will be described. In this modification, diodes D1 and D2 are added in the reference potential lines 3, respectively. Other structures are the same as those of the third embodiment, and the device operates in the same manner. The diodes D1 and D2 prevent the current short-circuiting the cells in the second cell group 12, even if both switches SW21 and SW22 are closed simultaneously.

Fourth Embodiment

A fourth embodiment of the present invention will be described with reference to FIGS. 9–12. The circuit structure of this embodiment is similar to that of the first embodiment, except for the diodes D1, D2 added in the reference potential lines 3 and a compensation circuit 5 added for canceling a voltage drop across the diode D1 and the switch SW21 (or a voltage drop across the diode D2 and the switch SW22). Only the structure and function different from the first embodiment will be described below.

The diodes D1, D2 prevent the current short-circuiting the unit cells in the second cell group 12 upon simultaneous closure of both switches SW21, SW22, in the same manner as in other similar embodiments described above.

Figure 9:
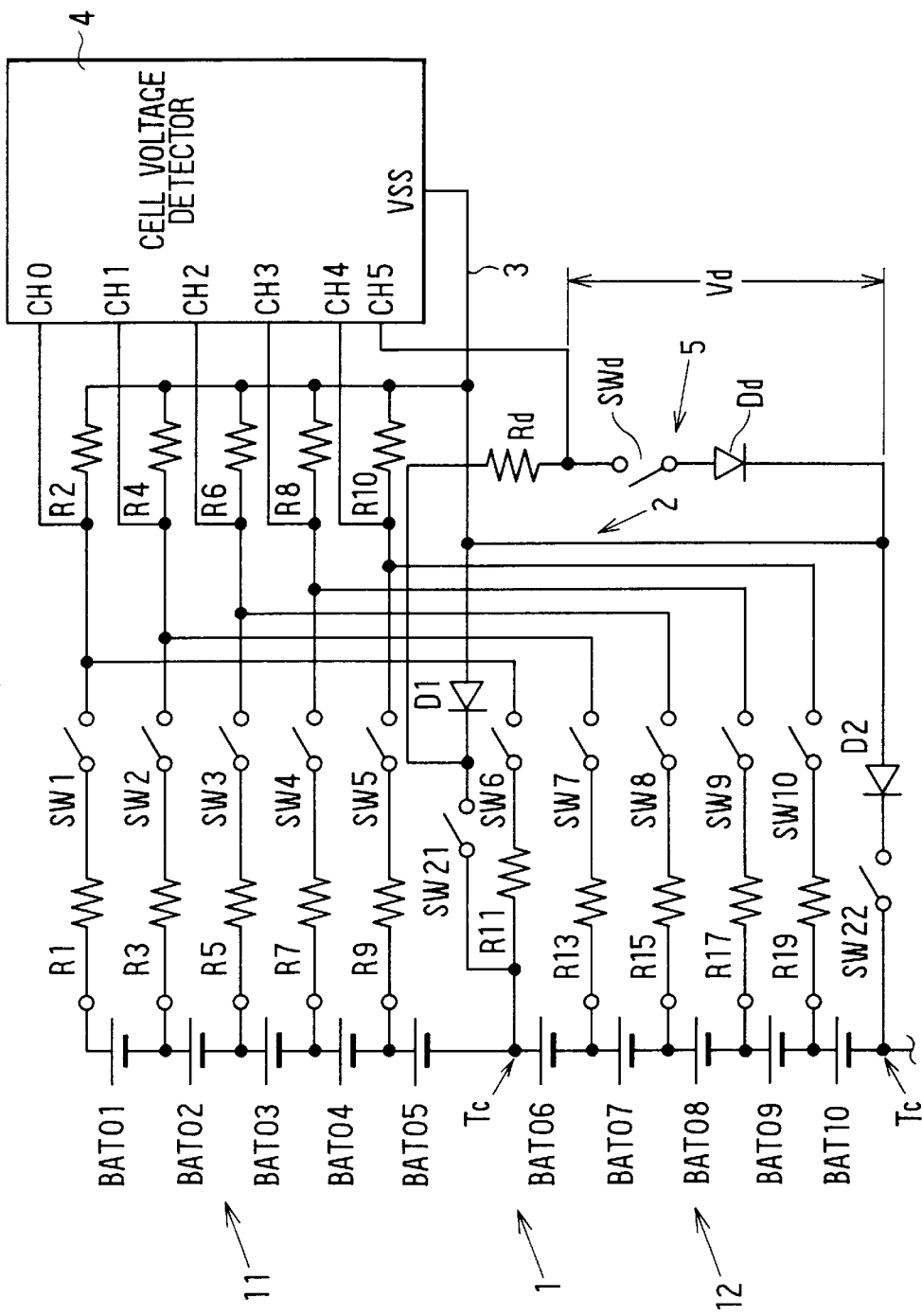
FIG. 9 is a circuit diagram showing a cell voltage detecting device as a fourth embodiment.

As shown in FIG. 9, the compensation circuit 5 is composed of a dummy resistor Rd, a dummy switch SWd and a dummy diode Dd, all connected in series. One end of the compensation circuit 5 is connected to a junction between the switch SW21 and the diode D1, and the other end thereof is connected to the reference potential line 3. A junction between the dummy resistor Rd and the dummy switch SWd is connected to a CH5 terminal of the cell voltage detector 4. The resistance of the dummy resistor Rd is selected, so that the same amount of current, as the current that flows through the diode D1 upon closure of switches SW1–SW5 and SW21 to detect the cell voltages in the first cell group 11 (which is equal to the current that flows through the diode D2 upon closure of switches SW6–SW10 and SW22 to detect the cell voltages in the second cell group 12), flows through the compensation circuit 5 upon closure of the dummy switch SWd. The dummy switch SWd is made in the same process as the switches SW21 and SW22, so that its characteristics are the same as those of the switches SW21 and SW22. Also, the dummy diode Dd is simulated to the diodes D1 and D2.

The compensation circuit 5 functions as follows. The switches SW1–SW10 are all opened, and both switches SW21, SW22 and the dummy switch SWd are closed. A current that flows through the compensation circuit 5 under these conditions causes a voltage drop Vd across the dummy switch SWd and the dummy diode Dd. The voltage drop Vd is substantially the same as the voltage drop appearing across the diode D1 and the switch SW21 when the cell voltages in the first cell group 11 are detected (or the voltage drop appearing across the diode D2 and switch SW22 when the cell voltages in the second cell group 12 are detected). The signal of the voltage drop Vd is fed to the cell voltage detector 4 as a potential CH5 which is processed by the cell voltage detector 4 and fed to the controller in the same manner as other divided potentials CH0–CH4, because an additional detector circuit that is the same as other detector circuits for processing the potentials CH0–CH4 is included in the cell voltage detector 4. The voltage of the unit cell BAT05 that is located at the bottom of the first cell group 11 is correctly detected by subtracting the potential CH5 from the potential CH4. Similarly, the voltage of the unit cell BAT10 located at the bottom of the second cell group 12 is correctly detected.

The voltages of the unit cells other than BAT05 (located at the bottom of the first cell group 11) and BAT09 (located at the bottom of the second cell group 12) are determined by subtracting a potential at a next lower cell terminal from a potential at each cell terminal after the divided potentials are converted into digital signals. Thus, the voltage drop across the diode D1 and the switch SW21 (or the voltage drop across the diode D2 and the switch SW22) is canceled. It is also possible to determined a cell voltage by directly converting a potential difference between a pair of neighboring cells into a digital signal in the A/D converter.

Figure 10:
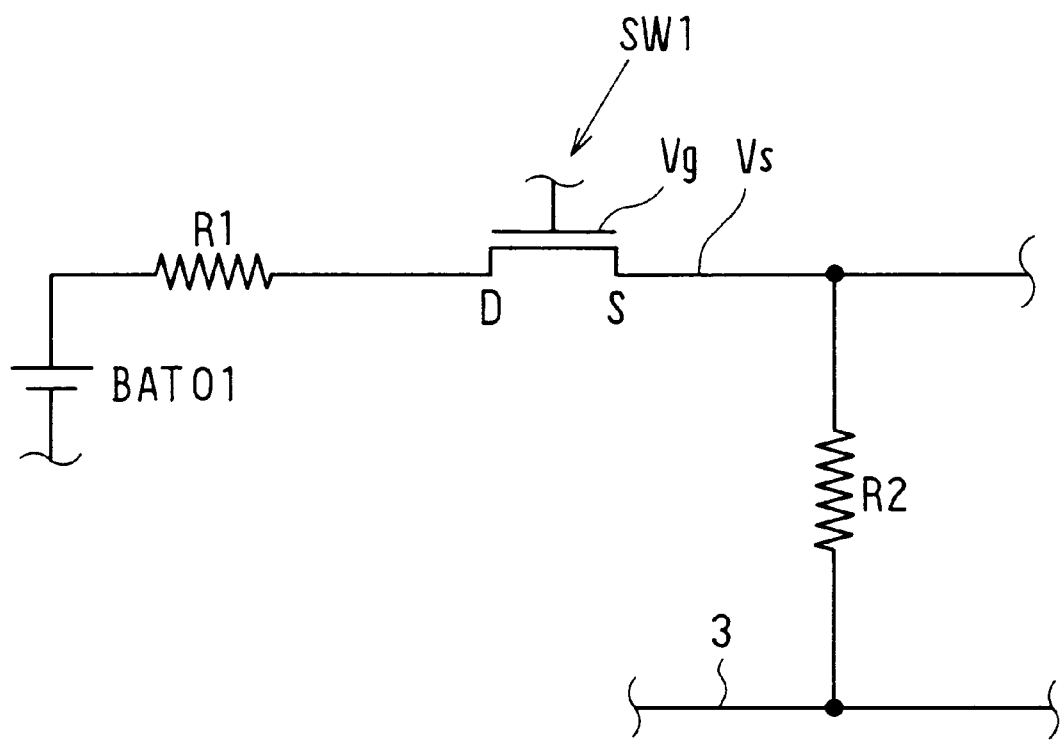
FIG. 10 is a circuit diagram showing an example of a switch used in the fourth embodiment.

Referring to FIG. 10, one example of the switch SW1–SW10 that is constituted by a MOSFET will be described. In FIG. 10, the switch SW1 is shown as an example. The switching operation is performed under a control voltage Vag that is a difference between a gate voltage Vg and a source voltage Vs of the MOSFET. Because the source voltage Vs is equal to the reference potential VSS when the switch SW1 is open, the switch SW1 can be operated under a low control voltage Vgs. The source voltage Vs is the divided voltage when the switch SW1 is closed, and therefore the switch SW1 can be sufficiently operated under a low control voltage Vgs. If the switch SW1 is positioned between the plus terminal of the unit cell BAT01 and the resistor R1, the source voltage Vs becomes substantially equal to the plus terminal voltage when the switch SW1 is closed, and the gate voltage Vg has to be higher than the plus terminal voltage. Therefore, in this case, a larger MOSFET having a higher voltage durability has to be used.

Figure 11:
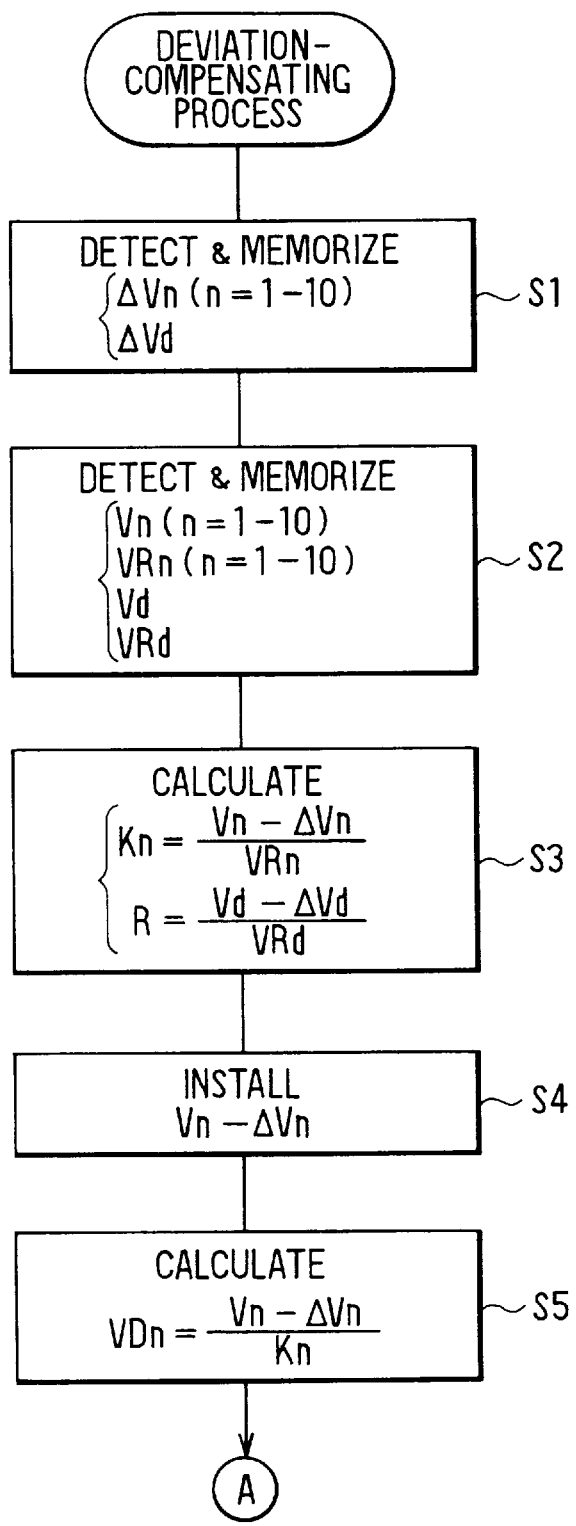
FIGS. 11 and 12 jointly show a flowchart of a deviation-compensating process performed in the fourth embodiment.
Figure 12:
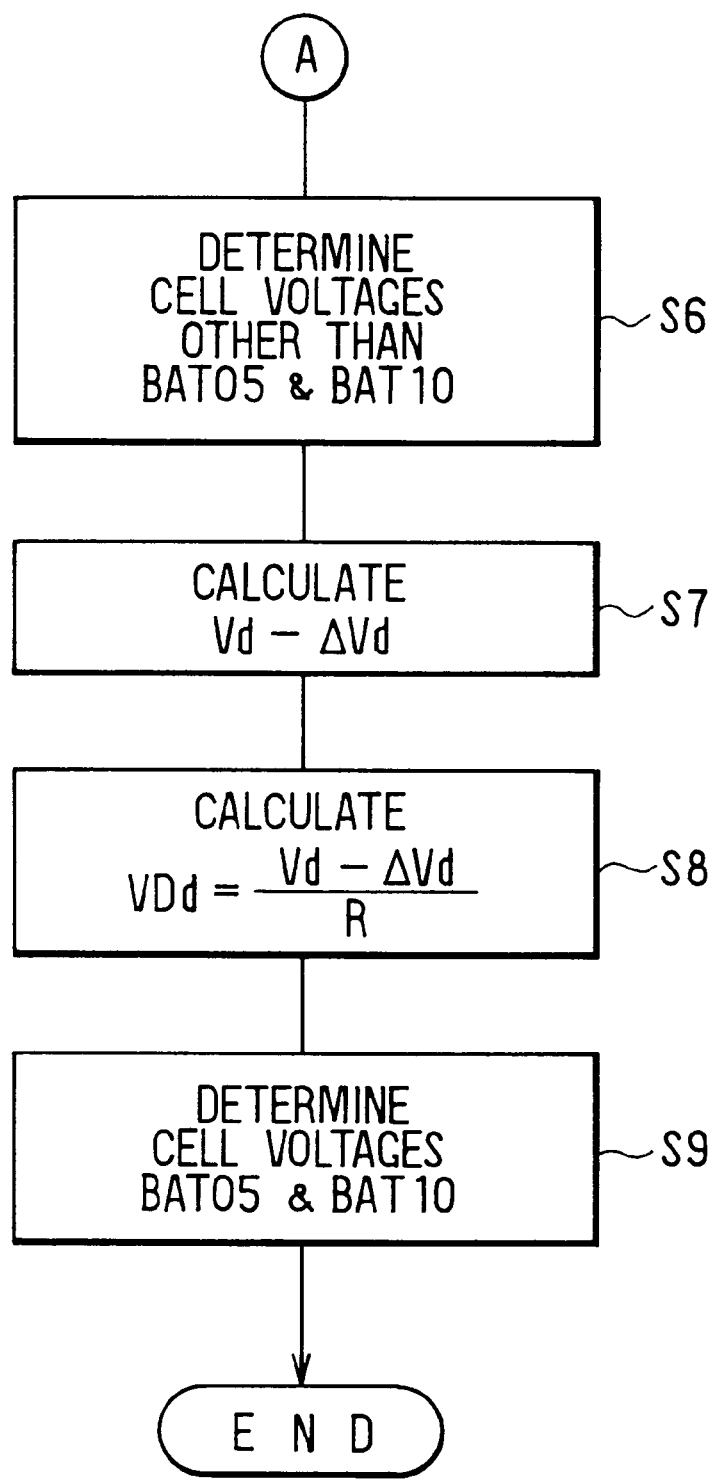

Referring to FIGS. 11 and 12, a process for compensating deviation of a detected cell voltage from a real cell voltage due to resistance unevenness among the resistors constituting the voltage divider circuits will be described. 20 It is, of course, preferable to make the resistance values of all the cell-side resistors R1–R19 equal, and to make the resistance value of all the reference-side resistors R2–R10 equal. It is not realistic, however, to eliminate all the unevenness among those resistors. The following process is to 25 compensate detected cell voltage deviation caused by the unevenness of the resistors. A routine for the deviation-compensating process is shown in a flowchart of FIGS. 11 and At step S1: First, the combination battery 1 is detached from the cell voltage detecting device, and all the cell-side ends of the resistors R1, R3, R5, R7 and R9 are short-circuited and connected to the common terminal Tc. The switches SW1–SW5 and SW21 are closed, and other switches are all opened. Then, output voltages from five cell voltage detector circuits are respectively detected and memorized as offset cell voltages $\Delta Vn$ (n=1–5). Similarly, all the cell-side ends of the resistors R11, R13, R15, R17 and R19 are short-circuited and connected to the lower common terminal Tc. The switches SW6–SW10 and SW22 are closed, and other switches are all opened. Then, output voltages from five cell voltage detector circuits are respectively detected and memorized as offset cell voltages $\Delta Vn$ (n=6–10). Thus, ten offset voltages $\Delta Vn$ (n=1–10) are detected and memorized. Each offset voltage $\Delta Vn$ is equal to the output voltage from the cell voltage detector circuit when no actual cell voltage is fed thereto. Then, switches SW21, SW22 and SWd are closed and all other switches are opened, and the output voltage from the detector circuit is detected and memorized as an offset voltage drop $\Delta Vd$. The offset voltage drop $\Delta Vd$ is equal to the voltage drop across the dummy switch SWd and the dummy diode Dd when no actual voltage is fed to the compensation circuit 5.

At step S2: The combination battery 1 and the cell voltage detecting device are connected in a normal way as shown in FIG. 9. Switches SW1–SW5 and SW21 are closed and all other swithches are opened. Then, the output voltages from five cell voltage detector circuits are respectively detected and memorized as output cell voltages Vn (n=1–5). The voltages of the unit cells BAT01–BAT05 are actually measured and memorized as real cell voltages VRn (n=1–5). Similarly, Switches SW6–SW10 and SW22 are closed and all other switches are opened. Then, the output voltages from five cell voltage detector circuits are respectively detected and memorized as output cell voltages Vn (n=6–10). The voltages of the unit cells BAT06–BAT10 are actually measured and memorized as real cell voltages VRn (n=6–10). Thus, all the output cell voltages Vn (n=1–10) and all the real cell voltages VRn (n=1–10) are detected and memorized. Then, the switches SW21, SW22 and SWd are closed and all other switches are opened, and the output form the detector circuit is detected and memorized as a voltage drop Vd. The voltage drop across the dummy switch SWd and the dummy diode Dd is actually measured and memorized as a real voltage drop VRd.

At step S3: The offset cell voltage drop ΔVn is subtracted from the output cell voltage Vn to obtain an offset-compensated cell voltage (Vn−ΔVn) for each unit cell. Then, the offset-compensated cell voltage (vn−Δvn) is divided by the corresponding real cell voltage VRn to obtain an adjusting factor Kn (n=1–10). Similarly, the offset voltage drop ΔVd is subtracted from the voltage drop Vd to obtain an offset-compensated voltage drop (Vd−ΔVd). The offset-compensated voltage drop (Vd−ΔVd) is divided by the real voltage drop VRd to obtain an adjusting factor R.

At step S4: The offset-compensated cell voltage (Vn−ΔVn) for each unit cell calculated at step S3 is installed here again.

At step S5: The voltage of each cell BAT01–BAT10 is finally determined as VDn (n=1–10) by dividing the offset-compensated cell voltage (Vn−ΔVn) by the corresponding adjusting factor Kn.

The process performed at steps S1–S5 is summarized as follows. All the voltage divider circuits and the cell voltage detector 4 are assumed as an unknown black box, and the output cell voltage Vn is expressed by the formula: Vn=Kn·VRn+ΔVn. The offset cell voltage ΔVn is detected as the output voltage when no cell voltage is supplied to the detector. The real cell voltage VRn is actually measured, and the output cell voltage Vn is detected by the detector. Then, the adjusting factor Kn is calculated from the formula: Kn=(Vn−ΔVn)/VRn. Finally, the cell voltage VDn is determined by dividing the offset-compensated cell voltage by the adjusting factor: VDn=(Vn−ΔVn)/Kn=VRn.

At step S6: The voltages of unit cells other than BAT05 (the cell at the bottom of the first cell group 11) and BAT10 (the cell at the bottom of the second cell group 12) are finalized by subtracting the voltage of a lower level cell in the same manner as described above.

At step S7: An offset-compensated voltage drop is calculated by subtracting the offset voltage drop ΔVd memorized at step Si from the voltage drop Vd detected at step S2. Namely, the offset compensated voltage drop=(Vd−ΔVd).

At step S8: The final voltage drop VDd across the dummy switch SWd and the dummy diode Dd is determined by dividing the offset-compensated voltage drop by the adjusting factor R calculated at step S3. Namely, VDd=(Vd−ΔVd)/R.

At step S9: The voltages of the unit cells BAT05 and BAT10 are finally determined by subtracting VDd from the VDn.

Though the process described above is easily performed by a microcomputer, the process may be modified or simplified.

Figure 13:
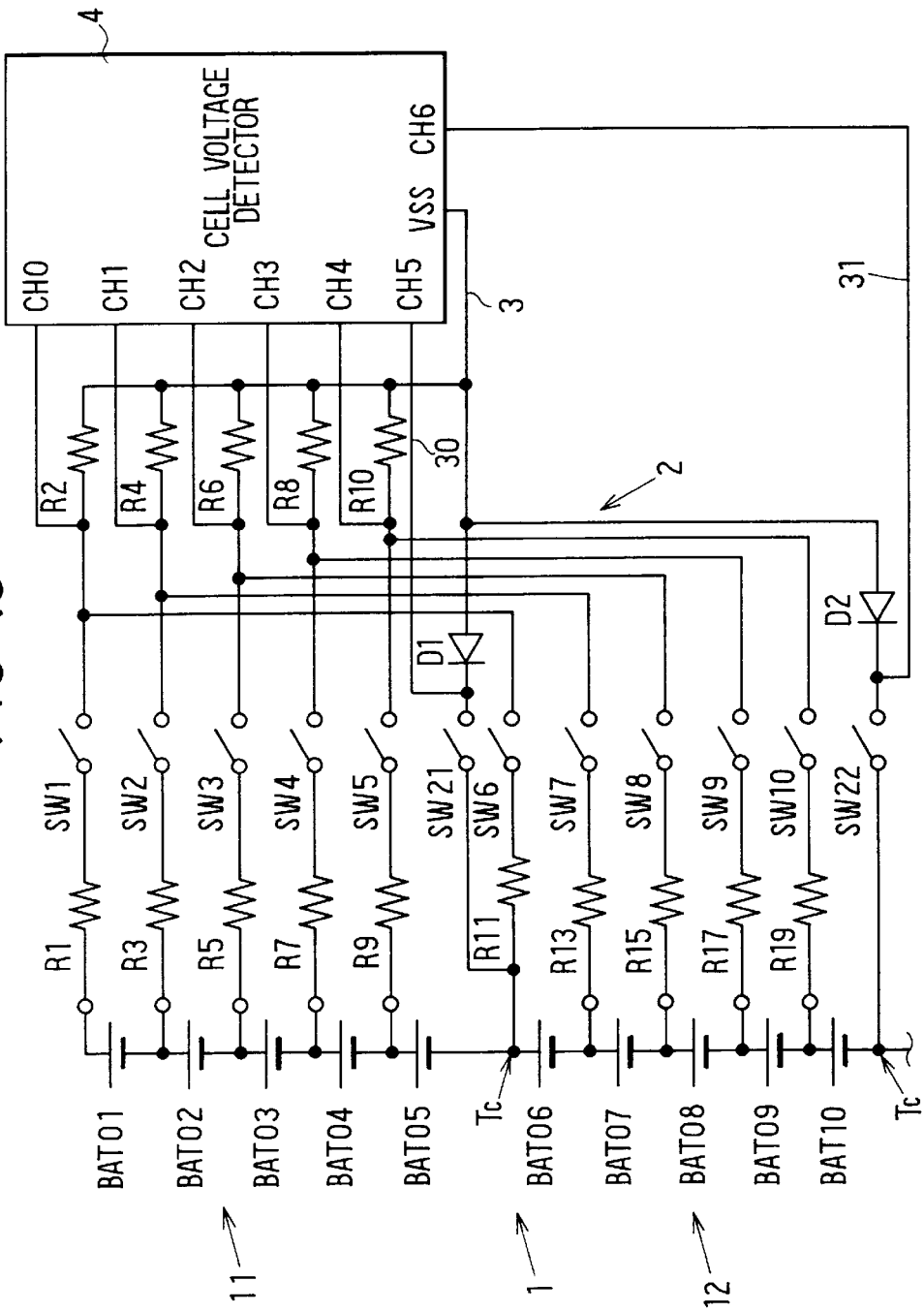
FIG. 13 is a circuit diagram showing a cell voltage detecting device as a first modification of the fourth embodiment.

A modification of the fourth embodiment is shown in FIG. 13. In this modification, the compensation circuit 5 of the fourth embodiment is simplified. A compensation circuit 30 is connected between the minus terminal of the diode D1 and the CH5 potential terminal, and the plus terminal of the diode D1 is connected to the reference potential line 3 having the reference potential VSS. The voltage drop across the diode D1 is detected by the detector 4. The cell voltage of BAT05 is determined by subtracting the voltage drop across the diode D1 from the divided potential of BAT05. Another compensation circuit 31 is connected between the minus terminal of the diode D2 and a potential terminal CH6, and the plus terminal of the diode D2 is connected to the reference potential VSS. The voltage drop across the diode D2 is similarly detected by the detector 4. The cell voltage of BAT10 is determined by subtracting the voltage drop across the diode D2 from the divided potential of BAT10. The deviation compensating process used in the fourth embodiment is applicable to this modification, too.

The voltage drop across the diode D1 and the switch SW21 (or D2 and SW22) may also be calculated in the following manner. The voltage drop at a room temperature is memorized in a microcomputer, and it is adjusted according to an operating temperature of the device. The operating temperature is detected by a temperature sensor or the like. The temperature-dependent characteristic of the voltage drop across the diode D1 and the switch SW21 is pre-installed in the microcomputer as a map. The voltage drop across the diode D2 and the switch SW22 is similarly calculated.

Figure 14:
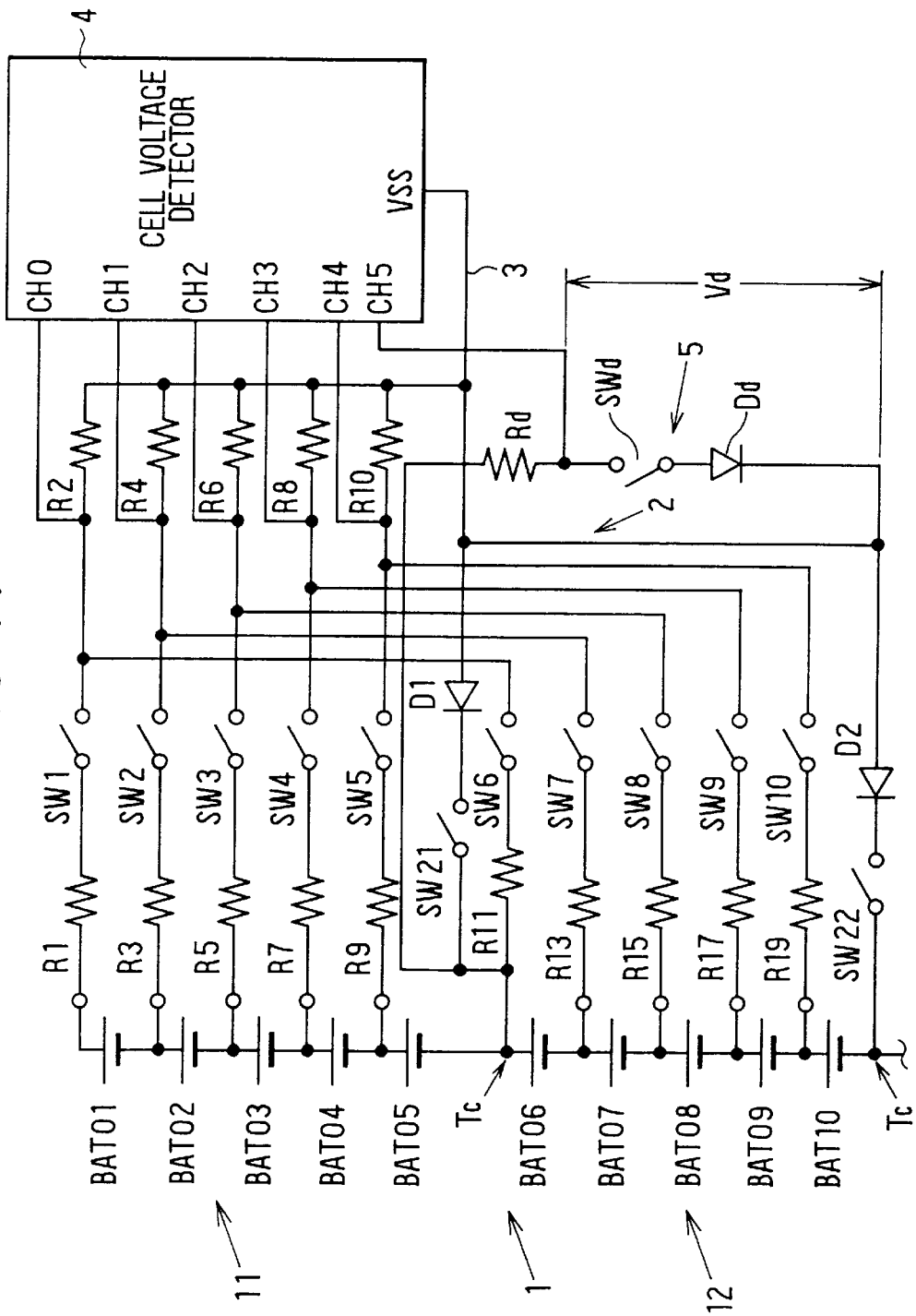
FIG. 14 is a circuit diagram showing a cell voltage detecting device as a second modification of the fourth embodiment.

Another modification of the fourth embodiment is shown in FIG. 14. In this modification, one end of the compensation circuit 5 is directly connected to the common terminal Tc. Since the switch SW21 is not included in a circuit from the common terminal Tc to the reference potential terminal CH5, the voltage drop Vd detected by the compensation circuit 5 better simulates the actual voltage drop across D1 and SW21 (or D2 and SW22).

Figure 15:
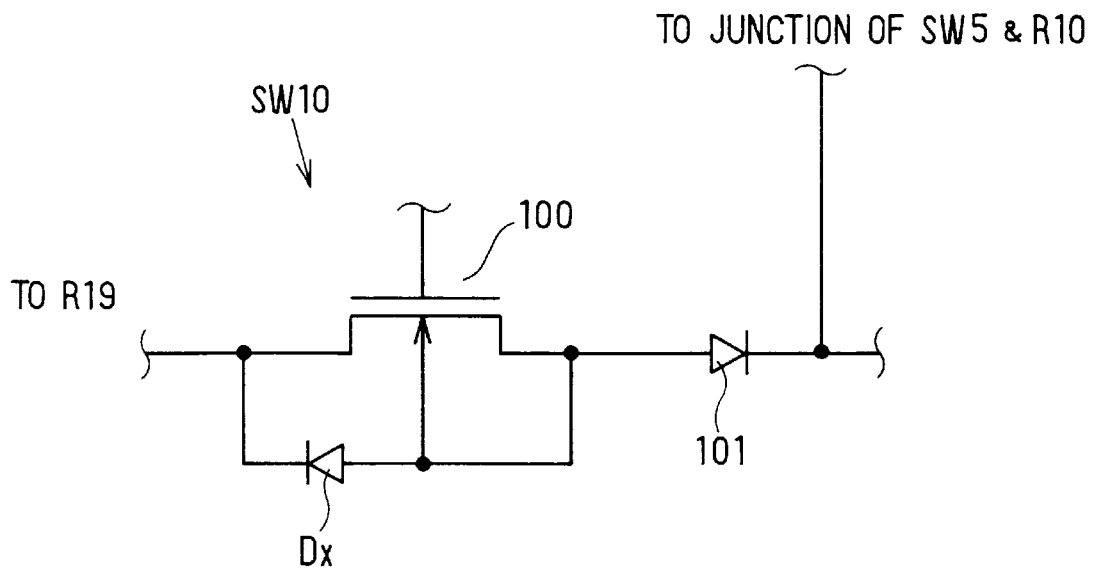
FIG. 15 is a circuit diagram showing an example of a switch used in the cell voltage detecting device.

Referring to FIG. 15, one exemplary structure of the switch SW1–SW10 will be explained, taking the switch SW10 as an example. The switch SW10 is composed of a MOS transistor 100 and a reverse-current-preventing diode 101. A parasitic diode of the MOS transistor 100 is shown as Dx. When the switch SW10 is structured in this form, no short-circuiting current flows through the switches SW5 and SW10 if both switches are simultaneously closed by accident or for any other reason.

Figure 16:
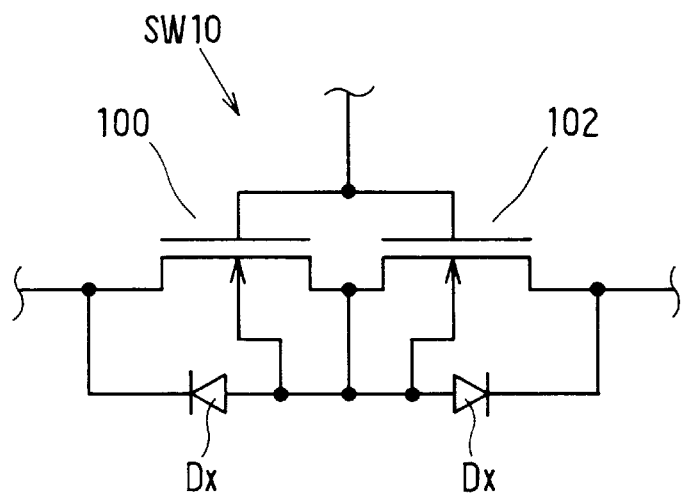
FIG. 16 is a circuit diagram showing another example of a switch used in the cell voltage detecting device.

Referring to FIG. 16, another exemplary structure of any of the switches SW1–SW10 , SW21 and SW22 will be explained, taking the switch SW10 as an example. The switch SW10 is composed of a pair of MOS transistors 100 and 102 which are connected so that both parasitic diodes Dx are connected in opposite directions to each other. In this switch structure, no short-circuiting current flows through the switches SW5 and SW10 even if both swathes are simultaneously closed. The same is true, of course, for other pairs of switches, SW1 and Sw6, SW2 and SW7, and so forth. The reverse-current-preventing diode 101 used in the switch shown in FIG. 15 may be added for further safety.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A unit cell voltage detecting device for a combination battery consisting of a plurality of unit cells connected in series, the plurality of unit cells being divided into several cell groups, the unit cell voltage detecting device comprising:

a plurality of voltage divider circuits each connected to each unit cell, the voltage divider circuit having at least a cell-side resistor connected to a plus terminal of the unit cell and a reference-side resistor connected in series to the cell-side resistor;

a plurality of reference potential lines, each connecting a common terminal representing a lowest potential of each cell group to the reference-side resistors of that cell group; and a cell voltage detector for detecting a cell voltage of each unit cell, a high potential side of the cell voltage detector being connected to a junction of the cell-side resistor and the reference-side resistor for receiving a divided potential therefrom, a low potential side of the cell voltage detector being connected to the reference potential line for receiving a reference potential therefrom, wherein:

each unit cell voltage is detected based on a potential difference between the divided potential and the reference potential.

2. The unit cell voltage detecting device as in claim 1, wherein:

a first switch for opening and closing the reference potential line is disposed in the reference potential line;

a second switch for opening and closing the voltage divider circuit is disposed in the voltage divider circuit; and the reference-side resistor in the voltage divider circuit for a unit cell in a first cell group having a highest potential is commonly used as the reference-side resistor for a corresponding unit cell in a second cell group and other cell groups.

3. The unit cell voltage detecting device as in claim 2, wherein:

a reverse-current-preventing diode is disposed in the reference potential line, so that current short-circuiting the second cell group is prevented from flowing through the reference potential line when first switches for the first and second cell groups are simultaneously closed.

4. The unit cell voltage detecting device as in claim 3, wherein:

a resistor is further connected in series to the reverse-current-preventing diode in the reference potential line.

5. The unit cell voltage detecting device as in claim 2, wherein:

a resistor is disposed in the reference potential line, so that an amount of current short-circuiting the second cell group is suppressed when first switches for the first and second cell groups are simultaneously closed.

6. The unit cell voltage detecting device as in claim 2, wherein:

a single resistor is commonly used as the reference-side resistor for all the voltage divider circuits.

7. The unit cell voltage detecting device as in claim 1, wherein:

a second switch for closing and opening the voltage divider circuit is disposed in the voltage divider circuit; and a single resistor is commonly used as the reference-side resistor for all the voltage divider circuits in each cell group.

8. The unit cell voltage detecting device as in claim 1, wherein:

a first switch for closing and opening the reference potential line is disposed in the reference potential line;

a second switch for closing and opening the voltage divider circuit is disposed between the cell-side resistor and the reference-side resistor in the voltage divider circuit; and the first and second switches for all the cell groups are integrated in a single circuit module.

9. The unit cell voltage detecting device as in claim 1, further including:

memory means for storing information adjusting a difference between a real cell voltage and a detected cell voltage and means for adjusting the detected cell voltage based on the stored information.

10. The unit cell voltage detecting device as in claim 9, wherein:

the memory means stores a ratio of the detected cell voltage to the real cell voltage; and the adjusting means divides the detected voltage by the ratio to obtain the real cell voltage.

11. The unit cell voltage detecting device as in claim 10, wherein:

the memory means memorizes an offset cell voltage that is an output voltage of the cell voltage detector when the combination battery is detached from the detecting device; and the adjusting means calculates the detected cell voltage by subtracting the offset cell voltage from the output voltage of the cell voltage detector.

12. The unit cell voltage detecting device as in claim 9, wherein:

the memory means memorizes an offset cell voltage that is an output voltage of the cell voltage detector when the combination battery is detached from the detecting device; and the adjusting means calculates the detected cell voltage by subtracting the offset cell voltage from the output voltage of the cell voltage detector.

13. The unit cell voltage detecting device as in claim 1, wherein:

a reverse-current-preventing diode and a first switch for closing and opening the reference potential line connected in series are disposed in the reference potential line;

a second switch for closing and opening the voltage divider circuit is disposed in each voltage divider circuit;

a compensation circuit for simulating a voltage drop across at least the reverse-current-preventing diode is connected to the reference potential line; and the cell voltage detector subtracts the simulated voltage drop from the divided potential received from the voltage divider circuit in a process to determine the cell voltage.

14. The unit cell voltage detecting device as in claim 13, wherein:

the voltages of the unit cells located at a lowest potential position in each cell group are determined based on the divided potential from which the simulated voltage drop is subtracted; and the voltages of unit cells other than the unit cells located at the lowest potential position in each cell group are determined based on a divided potential difference between the neighboring cells.

15. The unit cell voltage detecting device as in claim 13, wherein:

the compensation circuit simulates a voltage drop across the first switch and the reverse-current-preventing diode disposed in the reference potential line.

16. The unit cell voltage detecting device as in claim 1, wherein:

a reverse-current-preventing diode and a first switch for closing and opening the reference potential line connected in series are disposed in the reference potential line;

a second switch for closing and opening the voltage divider circuit is disposed in each voltage divider circuit; and the cell voltage detector includes a memory for prestoring a voltage drop across the reverse-current-preventing diode and the first switch, so that the prestored voltage drop is subtracted from the divided potential supplied to the cell voltage detector from the voltage divider circuit in determining the unit cell voltage.

17. The unit cell voltage detecting device as in claim 16, wherein:

the prestored voltage drop in the memory is adjusted based on a detected operating temperature of the cell voltage detecting device.

18. The unit cell voltage detecting device as in claim 1, wherein:

a reverse-current-preventing diode and a first switch for closing and opening the reference potential line connected in series are disposed in the reference potential line;

a second switch for closing and opening the voltage divider circuit is disposed in each voltage divider circuit; and the cell voltage detector includes means for detecting a voltage drop across the reverse-current-preventing diode and the first switch disposed in the reference potential line, so that the voltage drop is subtracted from the divided potential in determining the unit cell voltage.

* * * * *